United States Patent
Banerjee et al.

(10) Patent No.: US 8,627,245 B1
(45) Date of Patent: Jan. 7, 2014

(54) DENSITY BALANCING IN MULTIPLE PATTERNING LITHOGRAPHY USING INTEGRATED CIRCUIT LAYOUT FILL

(75) Inventors: Shayak Banerjee, White Plains, NY (US); Lars W. Liebmann, Poughquag, NY (US); Ian P. Stobert, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/596,140

(22) Filed: Aug. 28, 2012

(51) Int. Cl.
*G06F 17/50* (2006.01)

(52) U.S. Cl.
USPC ............................................. 716/55; 716/50

(58) Field of Classification Search
USPC ....................................... 716/55, 50
See application file for complete search history.

(56) References Cited

U.S. PATENT DOCUMENTS

| | | | | |
|---|---|---|---|---|
| 6,989,229 | B2 * | 1/2006 | Lucas et al. | 430/311 |
| 8,074,187 | B2 * | 12/2011 | Ylinen et al. | 716/54 |
| 8,239,789 | B2 * | 8/2012 | Brunner et al. | 716/55 |
| 2005/0216878 | A1 * | 9/2005 | Word et al. | 716/21 |
| 2007/0009146 | A1 * | 1/2007 | Hoeks et al. | 382/141 |
| 2007/0245284 | A1 * | 10/2007 | Sinha et al. | 716/10 |
| 2011/0269300 | A1 * | 11/2011 | Zia et al. | 438/479 |
| 2012/0040280 | A1 | 2/2012 | Agarwal et al. | |

OTHER PUBLICATIONS

Liebmann et al., "Decomposition-aware standard cell design flows to enable double-patterning technology", Proc. of SPIE 2011.
Lu et al., "A new graph-theoretic, multi-objective layout decomposition framework for Double Patterning Lithography," Proc. of Asia South Pacific Design Automation Conference, 2010.
Jeong et al., "Timing yield-aware color reassignment and detailed placement perturbation for double patterning lithography," Proc. of ICCAD 2009.
Cork et al., "Comparison of triple-patterning decomposition algorithms using aperiodic tiling patterns," Proc. of SPIE 2008.
Kahng et al., "Revisiting the Layout Decomposition Problem for Double Patterning Lithography," Proc. of SPIE, 2008.
Dusa et. al. "Pitch doubling through dual-patterning lithography challenges in integration and litho budgets," Proc. of SPIE, 2007.
U.S. Appl. No. 13/596,126, Office Action dated Aug. 13, 2013.
U.S. Appl. No. 13/596,126, Notice of Allowance and Fees Due dated Sep. 25, 2013.

* cited by examiner

*Primary Examiner* — Thuan Do
*Assistant Examiner* — Magid Dimyan
(74) *Attorney, Agent, or Firm* — Yuanmin Cai; Hoffman Warnick LLC (57) ABSTRACT

In various embodiments, a method of designing an integrated circuit (IC) layout for a multiple patterning layout fill process includes: providing a pre-characterized mask tile library including a plurality of distinct mask tiles each having a distinct mask density on a plurality of distinct exposures each associated with a patterning process in the multiple patterning process; determining a density of a mask group in a first layout window in the IC layout, the first layout window including an open space unfilled by the mask group; and selecting a set of mask tiles from the plurality of distinct mask tiles to fill a portion of the open space, the selecting based upon the determined density of the mask group in the first layout window and the distinct mask density of the selected set of mask tiles on the plurality of distinct exposures.

17 Claims, 5 Drawing Sheets

DENSITY BALANCING IN MULTIPLE PATTERNING LITHOGRAPHY USING INTEGRATED CIRCUIT LAYOUT FILL

FIELD

The subject matter disclosed herein relates to integrated circuits. More particularly, the subject matter relates to integrated circuit fabrication and layout design.

BACKGROUND

As integrated circuit (IC) devices (also referred to as semiconductor devices) advance technologically, these devices generally evolve to become physically smaller. In order to meet design constraints associated with these smaller devices, advanced patterning techniques have been developed. For example, multiple patterning techniques, such as double patterning and/or triple patterning may be used to meet design constraints in smaller devices (e.g., at the 14 nanometer (nm) node, and potentially beyond this node).

However, in the case of multiple patterning, decomposing a layout into, e.g., two exposures may not guarantee the desired patterning in the completed IC. That is, it is also critical to ensure that the density of shapes on both masks (in the double-patterning example) remains balanced, in order to ensure uniform etch behavior. However, it can be difficult to enforce these shape density parameters during the design process because IC designers are not responsible for particularly large areas of the IC. Conventional approaches of designing layouts for multiple patterning processes are deficient in producing the desired result.

BRIEF DESCRIPTION

Various embodiments include solutions for designing an integrated circuit (IC) layout for a multiple (e.g., double, triple, etc.) patterning layout fill process. In various embodiments, a method of designing an integrated circuit (IC) layout for a multiple patterning layout fill process includes: providing a pre-characterized mask tile library including a plurality of distinct mask tiles each having a distinct mask density on a plurality of distinct exposures each associated with a patterning process in the multiple patterning process; determining a density of a mask group in a first layout window in the IC layout, the first layout window including an open space unfilled by the mask group; and selecting a set of mask tiles from the plurality of distinct mask tiles to fill a portion of the open space, the selecting based upon the determined density of the mask group in the first layout window and the distinct mask density of the selected set of mask tiles on the plurality of distinct exposures.

A first aspect of the invention includes a method of designing an integrated circuit (IC) layout for a multiple patterning layout fill process, the method including: providing a pre-characterized mask tile library including a plurality of distinct mask tiles each having a distinct mask density on a plurality of distinct exposures each associated with a patterning process in the multiple patterning process; determining a density of a mask group in a first layout window in the IC layout, the first layout window including an open space unfilled by the mask group; and selecting a set of mask tiles from the plurality of distinct mask tiles to fill a portion of the open space, the selecting based upon the determined density of the mask group in the first layout window and the distinct mask density of the selected set of mask tiles on the plurality of distinct exposures.

A second aspect of the invention includes a system including: at least one computing device configured to design an integrated circuit (IC) layout for a multiple patterning layout fill process by performing actions including: providing a pre-characterized mask tile library including a plurality of distinct mask tiles each having a distinct mask density on a plurality of distinct exposures each associated with a patterning process in the multiple patterning process; determining a density of a mask group in a first layout window in the IC layout, the first layout window including an open space unfilled by the mask group; and selecting a set of mask tiles from the plurality of distinct mask tiles to fill a portion of the open space, the selecting based upon the determined density of the mask group in the first layout window and the distinct mask density of the selected set of mask tiles on the plurality of distinct exposures.

A third aspect of the invention includes a computer program product including program code stored on a computer-readable storage medium, which when executed by at least one computing device, causes the at least one computing device to perform actions including: providing a pre-characterized mask tile library including a plurality of distinct mask tiles each having a distinct mask density on a plurality of distinct exposures each associated with a patterning process in the multiple patterning process; determining a density of a mask group in a first layout window in the IC layout, the first layout window including an open space unfilled by the mask group; and selecting a set of mask tiles from the plurality of distinct mask tiles to fill a portion of the open space, the selecting based upon the determined density of the mask group in the first layout window and the distinct mask density of the selected set of mask tiles on the plurality of distinct exposures.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As noted, the subject matter disclosed herein relates to integrated circuits. More particularly, the subject matter relates to integrated circuit fabrication and layout design.

As described herein, in the case of multiple patterning, decomposing a layout into, e.g., two exposures may not guarantee the desired patterning in the completed IC. That is, it is also helpful to ensure that the density of shapes on both masks (in the double-patterning example) remains balanced, in order to ensure uniform etch behavior. However, it can be difficult to enforce these shape density parameters during the design process because IC designers are not responsible for large areas of the IC, but instead are typically focused on designing small components of the design, which are assembled by software tools on a large scale.

In contrast to the conventional approaches, various embodiments include improving uniform density during the lithography/exposure process, prior to polishing (e.g., chemical mechanical polishing, or CMP) to better control the uniform density of an integrated circuit. As described herein, various embodiments of the invention include approaches for balancing the types of exposure masks used in layout windows of an integrated circuit layout.

Various embodiments of the invention include a method of designing an integrated circuit (IC) layout for a multiple patterning process. In some cases, the method includes: providing a pre-characterized mask tile library including a plurality of distinct mask tiles each having a distinct mask density on a plurality of distinct exposures each associated with a patterning process; determining a density of a mask group in a first layout window in the IC layout, the first layout window including an open space unfilled by the mask group; and selecting a set of mask tiles from the plurality of distinct mask tiles to fill a portion of the open space, the selecting based upon the determined density of the mask group in the first layout window.

Various additional embodiments of the invention include a system having at least one computing device configured to design an integrated circuit (IC) layout for a multiple patterning process by performing actions including: providing a pre-characterized mask tile library including a plurality of distinct mask tiles each having a distinct mask density (spread across the multiple exposures); determining a density of a mask group in a first layout window in the IC layout, the first layout window including an open space unfilled by the mask group; and selecting a set of mask tiles from the plurality of distinct mask tiles to fill a portion of the open space, the selecting based upon the determined density of the mask group in the first layout window and the distinct mask density of the selected set of mask tiles on the plurality of distinct (multiple) exposures.

Various other embodiments of the invention includes a computer program product including program code stored on a computer-readable storage medium, which when executed by at least one computing device, causes the at least one computing device to perform actions including: providing a pre-characterized mask tile library including a plurality of distinct mask tiles each having a distinct mask density on a plurality of distinct exposures each associated with a patterning process; determining a density of a mask group in a first layout window in the IC layout, the first layout window including an open space unfilled by the mask group; and selecting a set of mask tiles from the plurality of distinct mask tiles to fill a portion of the open space, the selecting based upon the determined density of the mask group in the first layout window and the distinct mask density of the selected set of mask tiles on the plurality of distinct (multiple) exposures.

The various solutions disclosed utilize layout fill techniques in IC layout data preparation (or, dataprep) to balance the density of shapes on multiple exposures in addition to achieving density uniformity. These solutions are based on using a pre-characterized library of fill shapes having different densities at each exposure. The approach further includes using an optimization formulation to minimize the density imbalance in each layout window subject to meeting fill density constraints.

The various approaches of the invention include approaches for minimizing the density imbalance using various algorithms, e.g., a greedy algorithm. The approaches described according to various embodiments have several advantages: a) approaches according to embodiments reduce the burden of balancing densities on the IC designer; b) these approaches are agnostic to the method of layout decomposition used by the IC data processing components; c) these approaches require no more than small changes to the existing fill infrastructure; and d) these approaches run in linear time.

Figure 1:
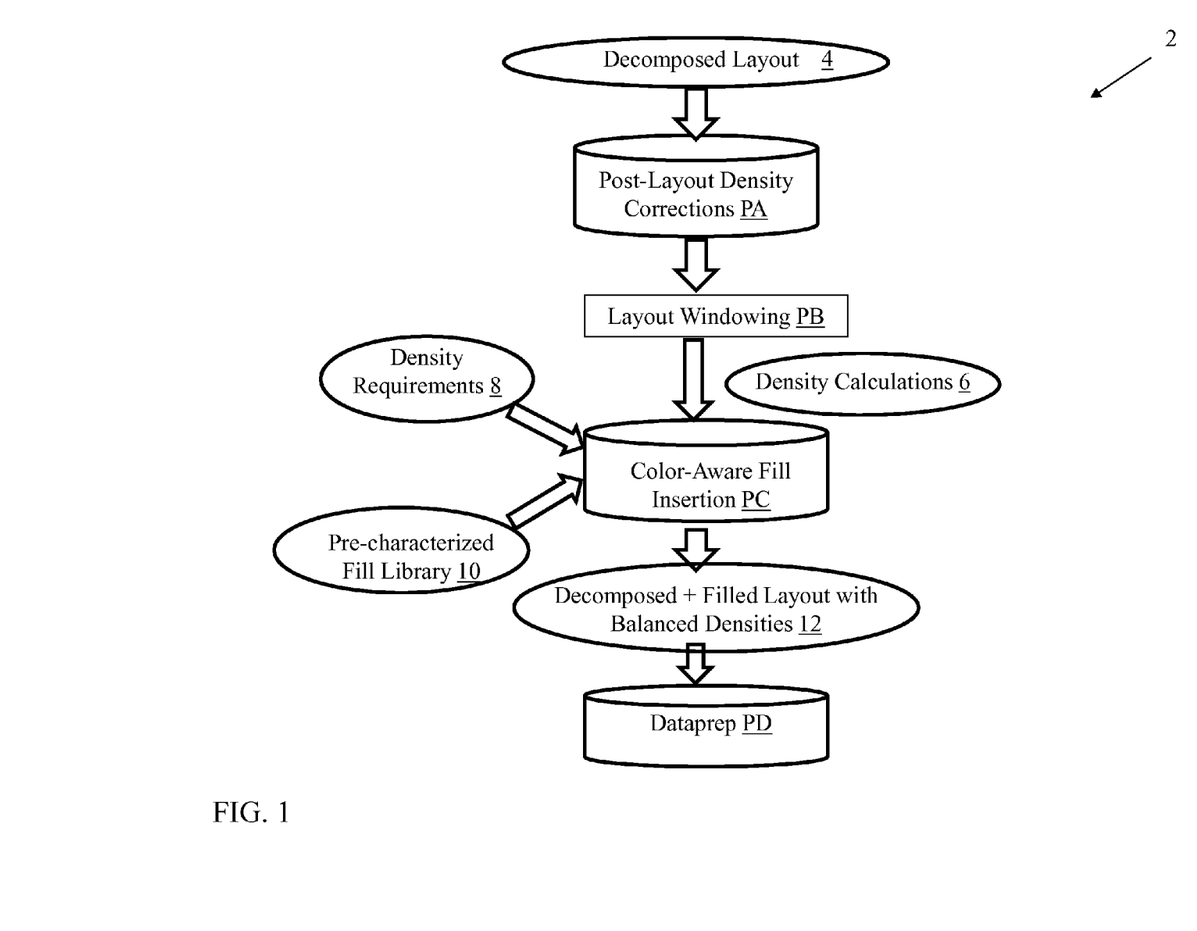
FIG. 1 shows a schematic data flow diagram according to various embodiments of the invention.

Turning to FIG. 1, an illustrative data flow diagram 2 is shown illustrating a process according to various embodiments of the invention. As shown, a first process (process PA) in this data flow can include correcting a decomposed layout 4 (data object 4) to account for density imbalances after the layout has been decomposed. This first process can be performed according to methods known in the art. For example, the layout of particular mask shapes used to form underlying components of the layout 4 can be modified in order to balance a density of a first type of shape against a second, third, fourth, etc., type of shape in the layout 4. A next process (process PB) can include layout windowing, where the IC layout is partitioned into a series of windows (or sub-layouts) for analysis on a smaller, more manageable scale. Layout windowing can be performed according to various embodiments of the invention. Next, in process PC, each layout window can be filled as well as balanced between various exposures according to the various embodiments of the invention. That is, process PC can include color-aware fill insertion, where the term "color" refers to a type of exposure mask. As used herein, different colors/patterns can refer to different types of exposure mask, e.g., red (hashed pattern in FIG. 2) correlating with mask shapes on the first exposure mask, green (white in FIG. 2) correlating with mask shapes on the second exposure mask, blue (black in FIG. 2) correlating with mask shapes on the third exposure mask, etc. Process PC (color-aware fill insertion) can include balancing the exposure density of each window in the IC layout, using density calculations 6 from the layout windowing (process PB), pre-determined density requirements 8 for each window, and a pre-characterized fill library 10 including a plurality of exposure mask types. As described herein, process PC can include an iterative process of filling each layout window in order to balance exposure densities. Following process PC, a decomposed and filled layout (with balanced densities) 12 is formed, which can then be utilized in process dataprep (process PD). Dataprep (process PD) can include conventional data preparation techniques known in the art for preparing layout data for fabrication (e.g., verifying spacing constraints, line constraints, via fill constraints, etc.).

Figure 2:
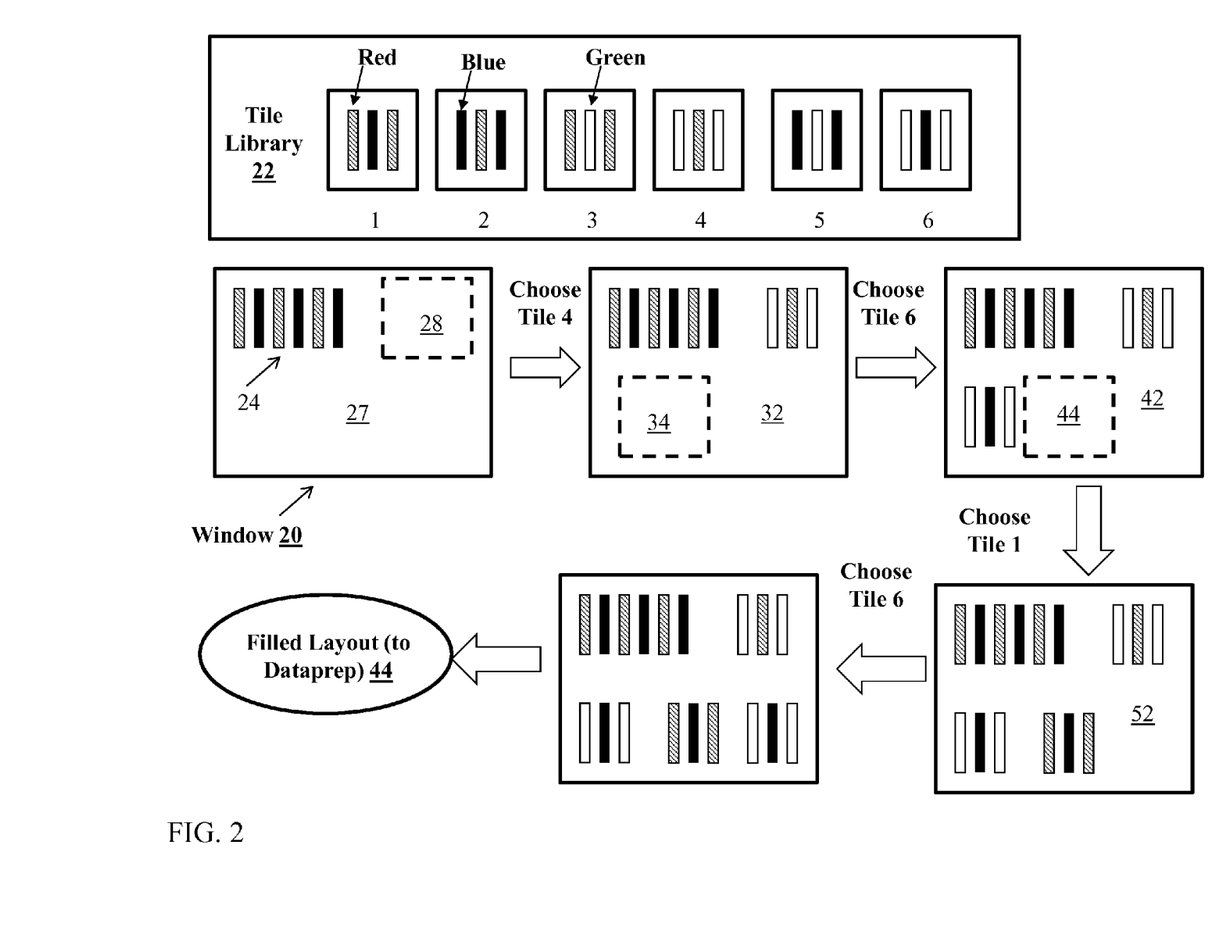
FIG. 2 shows an illustrative example of a schematic layout fill process according to various embodiments of the invention.

FIG. 2 shows an example of a schematic data flow according to various embodiments of the invention. As shown, a first layout window (e.g., from an integrated circuit) 20 is to be filled according to various embodiments of the invention. This schematic data flow includes a depiction of a tile library 22, which can be pre-formed according to various embodiments of the invention. The tile library 22 can include a plurality of mask layout configurations, which are shown with distinct combinations of "colors" or patterns (exposure masks), which leads to varying density of shapes for each color/pattern in each tile. As shown, the tile library 22 includes six (6) distinct mask layout configurations, with the following combinations:

1) Red-blue-red; 2) Blue-red-blue; 3) Red-green-red; 4) Green-red-green; 5) Blue-green-blue; and 6) Green-blue-green. It is understood that these tiles are only examples of the various combinations of mask configurations available to fill portions of the window 20 (e.g., a first layout window in a larger IC), consisting of different densities on each exposure. It is understood that the tile library 22 can include any number of tiles, and this example is only meant for illustrative purposes.

As shown, the window 20 can include an initial mask group 24 in the first layout window 22 in the IC layout. The first layout window 20 can include an open space 27 unfilled by the initial mask group 24. As shown in the data flow, a first process can include selecting a set of mask tiles (e.g., tile group 4) from the plurality of distinct mask tiles in the tile library 22 for a portion 28 of the open space 27. The selecting can be based upon the determined density of the mask group 24 in the first layout window 20 and the distinct mask density of the selected set of mask tiles on the plurality of distinct exposures.

The selecting process can include: a) determining a total area of the mask group 24 in the first layout window 20. In this case, the mask group 24 can be measured, or its area can be determined based upon the known size of each shape in the group 24 as well as a known or measured spacing between each shape in the group 24; b) calculating a shape density of the mask group 24 in the layout window 20. In this case, the shape density can be calculated by determining (e.g., measuring) the area (e.g., two-dimensional area) occupied by each shape (or each group of similar shapes corresponding to the same "color") as a percentage of the total area in the window 20, the total area of the open space 27 or the portion 28 of he open space; c) comparing that calculated shape density to a predetermined density threshold for the first layout window 20. The predetermined density threshold can be based upon a known maximum shape density for each type of shape. This known maximum shape density can be based upon spacing constraints in each level of the layout window, which can depend upon fabrication processes to be performed at each level of the layout window, along with tolerances associated with each fabrication process; d) comparing a shape density of a candidate set of mask tiles (e.g., at least one of tile 1, tile 2, tile 3, etc.) from the plurality of distinct mask tiles (in tile library 22) with a difference between the predetermined density threshold for the first layout window 20 and the shape density of the mask group 24; and selecting the candidate set of mask tile (e.g., at least one of tile 1, tile 2, tile 3, etc.) for insertion in the first layout window 22 in response to determining the shape density of the candidate set (e.g., at least one of tile 1, tile 2, tile 3, etc.) does not exceed the difference between the predetermined density threshold and the shape density of the mask group. This process is simplified in the depiction where tile 4, then tile 6, then tile 1, then tile 6 are selected (in series in this example) to fill the open space 26 in the layout window 20. It is understood that the above-noted processes for selecting at least one tile is iterated to select each subsequent tile (e.g., for selection of Tile 4, then Tile 6, then Tile 1, etc.). That is, the process of selecting can further include:

A) Determining a density of a combination of the mask group 24 and the set of mask tiles (e.g., Tile 4 in the first step) in the first layout window 20, the first layout window including a subsequent open space 32 unfilled by the mask group 24; and B) Selecting a subsequent set of mask tiles (e.g., Tile 6) from the plurality of distinct mask tiles (e.g., at least one of tile 1, tile 2, tile 3, etc.) for a portion 34 of the subsequent open space 32 based upon the density of the combination of the mask group 24 and the set of mask tiles (Tile 4) and the subsequent open space 32. This process is iterated for each subsequent open space (e.g., subsequent open space 32, subsequent open space 42 (with portion 44), subsequent open space 52, etc.).

After filling the layout window 20, the filled layout 44 including the selected group of tiles (e.g., tiles 4, 6, 1, 6, etc.) can be provided, e.g., for data preparation (Dataprep) as described with reference to FIG. 1. As noted herein, FIG. 2 illustrates but one example illustration of a method according to the various embodiments of the invention.

Figure 3:
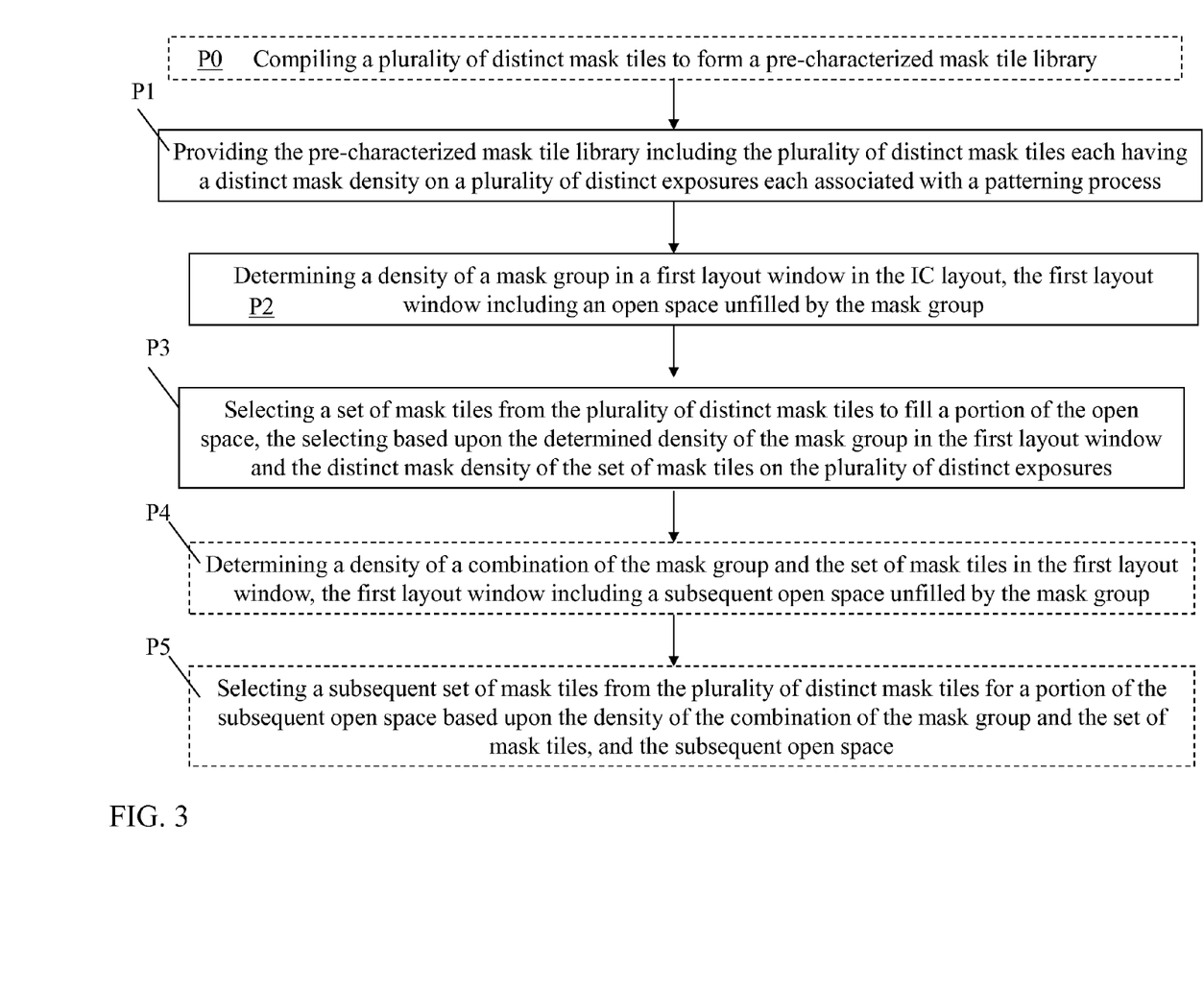
FIG. 3 shows a flow diagram illustrating a process according to various embodiments of the invention.
Figure 4:
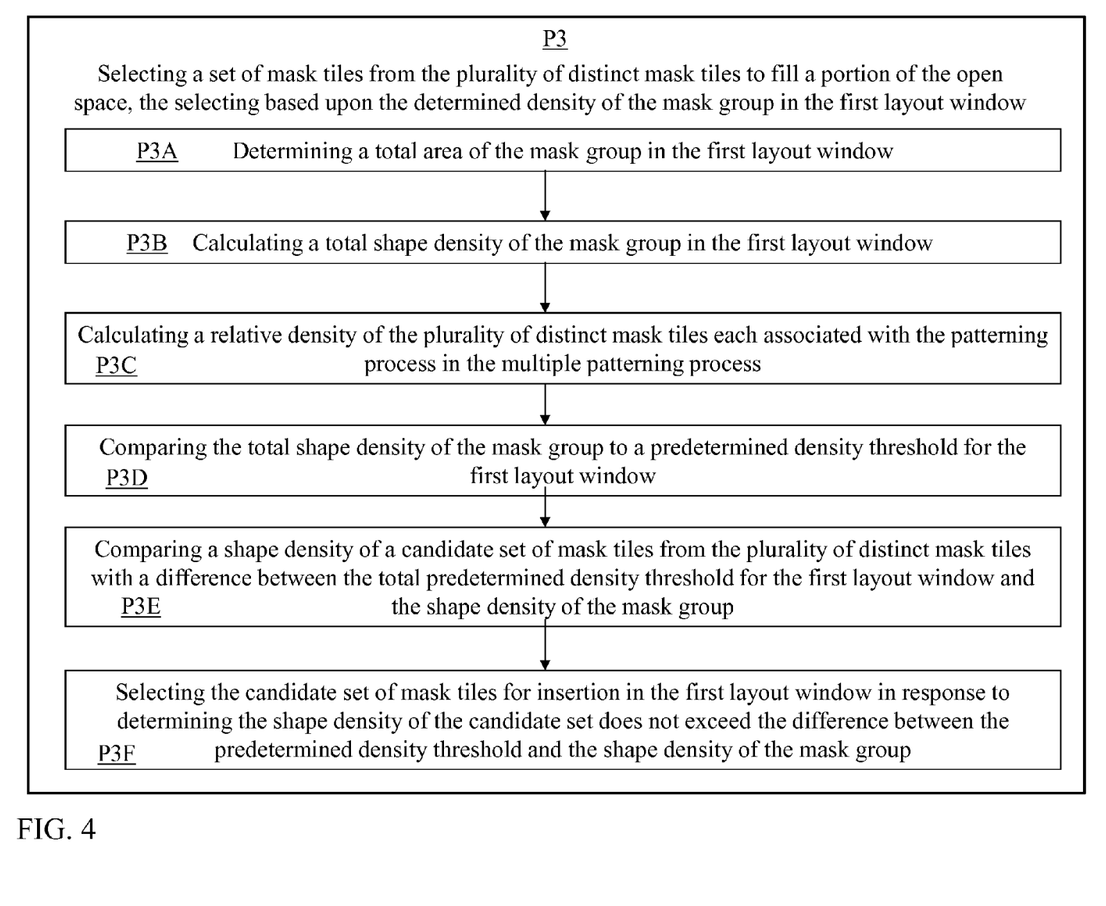
FIG. 4 shows a flow diagram illustrating a process according to various embodiments of the invention.

FIG. 3 shows a flow diagram illustrating methods according to various embodiments of the invention. As shown, the methods can include optional (or additional) processes (shown in phantom), which can be performed according to some embodiments. FIG. 4 shows a series of sub-processes associated with process P3 (selecting of a set of mask tiles), which further illustrate details associated with this process.

Turning to optional process P0, the method can include compiling a plurality of distinct mask tiles to form a pre-characterized mask tile library (e.g., as in FIG. 2), e.g., for a layout fill process described herein. This can include compiling a plurality of known or custom designed mask tiles into a library and saving the library in an accessible data store.

Process P1 can include providing the pre-characterized mask tile library for use in an integrated circuit (IC) design process, as described herein. As described herein, each of the plurality of distinct mask tiles has a distinct mask density on a plurality of distinct exposures each associated with a patterning process.

Process P2 can include determining a density of a mask group in a first layout window, where the first layout window includes an open space unfilled by the mask group. As described herein, the density of a mask group can be determined by measuring, calculating, or otherwise determining which portion of the area in the first layout window is occupied by the mask group. In some cases, the density can be a fraction, percentage, etc. of the total area in the first layout window. In other cases, the density of the mask group can be determined as a comparison with other mask group(s) in the first layout window.

Process P3 can include selecting a set of mask tiles from the plurality of distinct mask tiles to fill a portion of the open space. The selecting can be based upon the determined density of the mask group in the first layout window, especially accounting for the different relative densities of the exposure masks, and the distinct mask density of the selected set of mask tiles on the plurality of distinct exposures.

Turning to FIG. 4, sub-processes in process P3 are illustrated, including:

Process P3A: Determining a total area of the mask group in the first layout window, e.g., by measuring or otherwise calculating the area occupied by the mask group within the first layout window;

Process P3B: Calculating a shape density of the mask group in the first layout window, e.g., by determining a percentage of the mask group's area attributable to each shape (also referred to as a color), e.g., red is ⅓ of the area of the mask group and accounts for ⅓ of the total area of the mask group;

Process P3C: Comparing the shape density of the mask group (e.g., ⅓ red, ⅔ green) to a predetermined density threshold (e.g., A/B red, D/E green, F/G blue) for the first layout window, where the predetermined density threshold is calculated based upon a desired shape density at different levels of the layout (into and out of the page in FIG. 2, and distinct colors can represent different masks at different levels of that layout);

Process P3D: Comparing the total shape density (the composite shape density) of the mask group to a predetermined density threshold (for composite shape density) for the first layout window;

Process P3E: Comparing a shape density of a candidate set of mask tiles from the plurality of distinct mask tiles with a difference between the total predetermined density threshold for the first layout window and the shape density of the mask group; and Process P3F: selecting the candidate set of mask tiles for insertion in the first layout window in response to determining the shape density of the candidate set does not exceed the difference between the predetermined density threshold and the shape density of the mask group, accounting for the imbalance of densities between the various exposures in the layout. That is, in this process, the selecting of the candidate set of mask tiles reduces an imbalance of densities between the plurality of distinct exposures.

Returning to FIG. 3, additional (optional) process P4 can include determining a density of a combination of the mask group (after being inserted into the layout) and the set of mask tiles previously present in the first layout window, e.g., by combining the measured or otherwise calculated areas of these groups as a percentage of the total area in the layout window. In this case, the first layout window can include a subsequent open space unfilled by the mask group.

Additional (optional) process P5 can include selecting a subsequent set of mask tiles from the plurality of distinct mask tiles for a portion of the subsequent open space based upon: the density of the combination of the mask group and the set of mask tiles, and the subsequent open space.

In one particular example, a method according to various embodiments of the invention can include using a heuristic based algorithm for determining which fill shape(s) (e.g., tiles) to select for filing open space in an IC layout. For the three-color example shown and described herein, the following algorithm can be used to determine a fill shape for each iteration:

1. Calculate total area of shapes in window ($A_{cur}$);
2. Calculate shape density $D_{window}=A_{cur}/A_{window}$;
3. While $D_{window}<D_{min}$ (min. required fill density);
4. Calculate density of each shape (color) $d_{E1}$, $d_{E2}$, $d_{E3}$;
5. Set Min_Cost=$(d_{E1}-d_{E2})^2+(d_{E2}-d_{E3})^2+(d_{E3}-d_{E1})^2$;
6. For i=1 to $N_{tiles}$ (number of tiles):
   i. Look at area of each color in the tile $T_i$ ($A_{E1}$, $A_{E2}$, $A_{E3}$);
ii. Calculate updated tile densities $t_{Ei}=(d_{Ei}+A_{Ei}/A_{window})$;
   iii. New_Cost=$(t_{E1}-t_{E2})^2 (t_{E2}-d_{E3})^2+(t_{E3}-d_{E1})^2$;
   iv. If New_Cost<Min_Cost, set Selected_Tile=$T_i$;
7. Next i;
8. Update window with tile Selected_Tile;
9. Update $A_{cur}=A_{cur}+\Sigma_i A_{Ei}$, re-calculate $D_{window}$; and
10. If $D_{window} \geq D_{min}$ (min. required fill density) or there is no more space to fill, stop, else go to step 3.

Figure 5:
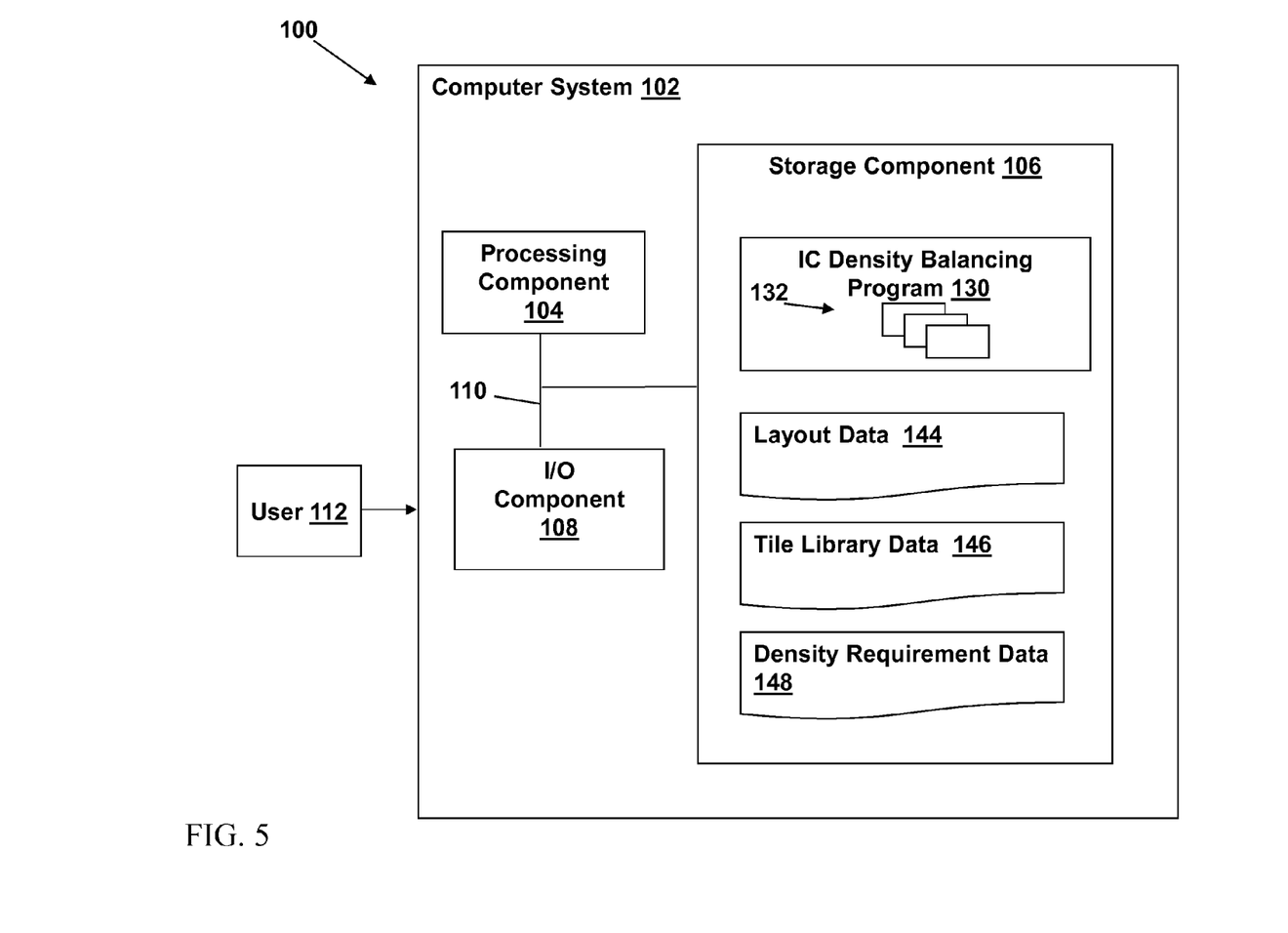
FIG. 5 shows an illustrative environment including a system according to various embodiments of the invention.

FIG. 5 depicts an illustrative environment 100 for balancing densities in an integrated circuit layout according to an embodiment. To this extent, the environment 100 includes a computer system 102 that can perform a process described herein in order to balance IC layout density in an integrated circuit design. In particular, the computer system 102 is shown as including an IC density balancing program 130, which makes computer system 102 operable to handle balancing integrated circuit layout density by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the IC density balancing program 130, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a human user 112 to interact with the computer system 102 and/or one or more communications devices to enable a system user 112 to communicate with the computer system 102 using any type of communications link. To this extent, the IC density balancing program 130 can manage a set of interfaces (e.g., graphical user interface(s), application program interface, etc.) that enable human and/or system users 112 to interact with the IC density balancing program 130. Further, the IC density balancing program 130 can manage (e.g., store, retrieve, create, manipulate, organize, present, etc.) data, such as layout data 144, tile library data 146 and/or density requirement data 148 etc., using any solution.

In any event, the computer system 102 can comprise one or more general purpose computing articles of manufacture (e.g., computing devices) capable of executing program code, such as the IC density balancing program 130, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the IC density balancing program 130 can be embodied as any combination of system software and/or application software.

Further, the IC density balancing program 130 can be implemented using a set of modules 132. In this case, a module 132 can enable the computer system 102 to perform a set of tasks used by the IC density balancing program 130, and can be separately developed and/or implemented apart from other portions of the IC density balancing program 130. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of IC density balancing program 130 fixed thereon (e.g., one or more modules 132). However, it is understood that the computer system 102 and IC density balancing program 130 are only representative of various possible equivalent computer systems that may perform a process described herein. To this extent, in other embodiments, the functionality provided by the computer system 102 and IC density balancing program 130 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as layout data 144, tile library data 146 and/or density requirement data 148 using any solution. For example, the computer system 102 can generate and/or be used to generate layout data 144, tile library data 146 and/or density requirement data 148, layout data 144, tile library data 146 and/or density requirement data 148, from one or more data stores, layout data 144, tile library data 146 and/or density requirement data 148, from another system, send layout data 144, tile library data 146 and/or density requirement data 148 to another system, etc.

While shown and described herein as a method and system for balancing IC layout density, it is understood that aspects of the invention further provide various alternative embodiments. For example, in one embodiment, the invention provides a computer program fixed in at least one computer-readable medium, which when executed, enables a computer system to balance IC layout density. To this extent, the computer-readable medium includes program code, such as the IC density balancing program 130 (FIG. 5), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the IC density balancing program 130 (FIG. 5), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for correcting a mask deviation. In this case, a computer system, such as the computer system 102 (FIG. 5), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A method of designing an integrated circuit (IC) layout for a multiple patterning layout fill process using at least one computing device, the method comprising:

providing a pre-characterized mask tile library including a plurality of distinct mask tiles each having a distinct mask density on a plurality of distinct exposures each associated with a patterning process in the multiple patterning process;

determining a density of a mask group in a first layout window in the IC layout, the first layout window including an open space unfilled by the mask group; and selecting a set of mask tiles from the plurality of distinct mask tiles to fill a portion of the open space using the at least one computing device, the selecting based upon the determined density of the mask group in the first layout window and the distinct mask density of the selected set of mask tiles on the plurality of distinct exposures,
wherein the selecting of the set of mask tiles from the plurality of distinct mask tiles to fill the portion of the open space includes:
   determining a total area of the mask group in the first layout window;
   calculating a total shape density of the mask group in the first layout window;
   calculating a relative density of the plurality of distinct mask tiles each associated with the patterning process in the multiple patterning process;
   comparing the total shape density of the mask group to a predetermined density threshold for the first layout window;
   comparing a shape density of a candidate set of mask tiles from the plurality of distinct mask tiles with a difference between the predetermined density threshold for the first layout window and the shape density of the mask group; and
   selecting the candidate set of mask tiles for insertion in the first layout window in response to determining the shape density of the candidate set does not exceed the difference between the predetermined density threshold and the shape density of the mask group,
   wherein the selecting of the candidate set of mask tiles reduces an imbalance of densities between the plurality of distinct exposures.

2. The method of claim 1, further comprising dividing the IC layout into a plurality of layout windows prior to the determining of the density of the first layout window in the IC layout.

3. The method of claim 1, wherein the determining of the density of the mask group in the first layout window includes calculating a density of each exposure within the first layout window.

4. The method of claim 1, further comprising:
determining a total number of each of the plurality of distinct mask tiles for the first layout window,
wherein the selecting of the set of mask tiles is further based upon the determined total number of each of the plurality of distinct mask tiles for the first layout window.

5. The method of claim 1, wherein the plurality of distinct mask tiles each have a substantially equal area and have distinct densities of shapes on each of the plurality of distinct exposures.

6. The method of claim 1, further comprising:
determining a density of a combination of the mask group and the set of mask tiles in the first layout window, the first layout window including a subsequent open space unfilled by the mask group; and
selecting a subsequent set of mask tiles from the plurality of distinct mask tiles to fill a portion of the subsequent open space based upon the density of the combination of the mask group and the set of mask tiles and the subsequent open space.

7. The method of claim 1, further comprising compiling the plurality of distinct mask tiles to form the pre-characterized mask tile library prior to the providing of the pre-characterized mask tile library.

8. A system comprising:
at least one computing device configured to design an integrated circuit (IC) layout for a multiple patterning layout fill process by performing actions including:
   providing a pre-characterized mask tile library including a plurality of distinct mask tiles each having a distinct mask density on a plurality of distinct exposures each associated with a patterning process in the multiple patterning process;
   determining a density of a mask group in a first layout window in the IC layout, the first layout window including an open space unfilled by the mask group;
   selecting a set of mask tiles from the plurality of distinct mask tiles to fill a portion of the open space, the selecting based upon the determined density of the mask group in the first layout window and the distinct mask density of the selected set of mask tiles on the plurality of distinct exposures;
   determining a density of a combination of the mask group and the set of mask tiles in the first layout window, the first layout window including a subsequent open space unfilled by the mask group; and
   selecting a subsequent set of mask tiles from the plurality of distinct mask tiles to fill a portion of the subsequent open space based upon the density of the combination of the mask group and the set of mask tiles and the subsequent open space.

9. The system of claim 8, wherein the at least one computing device is further configured to divide the IC layout into a plurality of layout windows prior to the determining of the density of the first layout window in the IC layout.

10. The system of claim 8, wherein the determining of the density of the mask group in the first layout window includes calculating a density of each exposure within the first layout window.

11. The system of claim 8, wherein the at least one computing device is further configured to:
determine a total number of each of the plurality of distinct mask tiles for the first layout window,
wherein the selecting of the set of mask tiles is further based upon the determined total number of each of the plurality of distinct mask tiles for the first layout window.

12. The system of claim 8, wherein the selecting of the set of mask tiles from the plurality of distinct mask tiles to fill open space includes:
determining a total area of the mask group in the first layout window;
calculating a total shape density of the mask group in the first layout window;
calculating a relative density of the plurality of distinct mask tiles each associated with the patterning process in the multiple patterning process;
comparing the total shape density of a candidate set of mask tiles from the plurality of distinct mask tiles with a difference between the predetermined density threshold for the first layout window and the shape density of the mask group; and
selecting the candidate set of mask tiles for insertion in the first layout window in response to determining the shape density of the candidate set does not exceed the difference between the predetermined density threshold and the shape density of the mask group,
wherein the selecting of the candidate set of mask tiles reduces an imbalance of densities between the plurality of distinct exposures.

13. The system of claim 8, wherein the plurality of distinct mask tiles each have a substantially equal area and have distinct densities of shapes on each of the plurality of distinct exposures.

14. The system of claim 8, wherein the at least one computing device is further configured to:

compile the plurality of distinct mask tiles to form the pre-characterized mask tile library prior to the providing of the pre-characterized mask tile library.

15. A computer program product having program code stored on a non-transitory computer-readable medium, which when executed by at least one computing device, causes the at least one computing device to perform actions comprising:

providing a pre-characterized mask tile library including a plurality of distinct mask tiles each having a distinct mask density on a plurality of distinct exposures each associated with a patterning process in the multiple patterning process;

determining a density of a mask group in a first layout window in the IC layout, the first layout window including an open space unfilled by the mask group;

selecting a set of mask tiles from the plurality of distinct mask tiles to fill a portion of the open space, the selecting based upon the determined density of the mask group in the first layout window and the distinct mask density of the selected set of mask tiles on the plurality of distinct exposures; and determining a total number of each of the plurality of distinct mask tiles for the first layout window, wherein the selecting of the set of mask tiles is further based upon the determined total number of each of the plurality of distinct mask tiles for the first layout window.

16. The computer program of claim 15, wherein the selecting of the set of mask tiles from the plurality of distinct mask tiles to fill open space includes:

determining a total area of the mask group in the first layout window;

calculating a total shape density of the mask group in the first layout window;

calculating a relative density of the plurality of distinct mask tiles each associated with the patterning process in the multiple patterning process;

comparing the total shape density of a candidate set of mask tiles from the plurality of distinct mask tiles with a difference between the predetermined density threshold for the first layout window and the shape density of the mask group; and selecting the candidate set of mask tiles for insertion in the first layout window in response to determining the shape density of the candidate set does not exceed the difference between the predetermined density threshold and the shape density of the mask group, wherein the selecting of the candidate set of mask tiles reduces an imbalance of densities between the plurality of distinct exposures.

17. The program product of claim 15, wherein the at least one computing device further performs:

determining a density of a combination of the mask group and the set of mask tiles in the first layout window, the first layout window including a subsequent open space unfilled by the mask group; and selecting a subsequent set of mask tiles from the plurality of distinct mask tiles to fill a portion of the subsequent open space based upon the density of the combination of the mask group and the set of mask tiles and the subsequent open space.

* * * * *